United States Patent
Familiant et al.

(10) Patent No.: US 10,741,313 B1
(45) Date of Patent: Aug. 11, 2020

(54) BUS BAR ASSEMBLY WITH INTEGRATED SURGE ARRESTOR

(71) Applicant: Eaton Intelligent Power Limited, Dublin (IE)

(72) Inventors: Yakov L. Familiant, Thiensville, WI (US); Paul J. Rollmann, Menomonee Falls, WI (US); Andrew A. Rockhill, Waukesha, WI (US)

(73) Assignee: Eaton Intelligent Power Limited (IE)

( * ) Notice: Subject to any disclaimer, the term of this patent is extended or adjusted under 35 U.S.C. 154(b) by 0 days.

(21) Appl. No.: 16/269,162

(22) Filed: Feb. 6, 2019

(51) Int. Cl.
*H01C 7/12* (2006.01)
*H02G 5/00* (2006.01)

(52) U.S. Cl.
CPC ............... *H01C 7/12* (2013.01); *H02G 5/005* (2013.01)

(58) Field of Classification Search
None
See application file for complete search history.

(56) References Cited

U.S. PATENT DOCUMENTS

| | | | | |
|---|---|---|---|---|
| 1,071,279 A * | 8/1913 | Van Deventer | ......... | H01J 19/42 313/268 |
| 3,180,922 A * | 4/1965 | Gallant | ................ | H02G 5/025 174/70 B |
| 3,202,756 A * | 8/1965 | Stanback | ................ | H02G 5/06 174/99 B |
| 3,384,856 A * | 5/1968 | Fisher | ...................... | H02G 5/06 439/213 |
| 3,418,535 A * | 12/1968 | Martinell | ................ | H01L 23/32 361/805 |
| 3,459,872 A * | 8/1969 | Shannon | ................ | H02G 5/007 174/71 B |
| 3,472,946 A * | 10/1969 | Lawrence | .............. | H02G 5/007 174/68.2 |
| 3,555,293 A * | 1/1971 | Shannon | ................ | H02G 5/007 307/147 |
| 3,639,676 A * | 2/1972 | Dempsey, Jr. | ........... | H02G 5/06 174/68.3 |
| 3,732,353 A * | 5/1973 | Koenig | .................... | H02G 5/06 174/68.2 |

(Continued)

FOREIGN PATENT DOCUMENTS

| | | |
|---|---|---|
| EP | 1077452 | 2/2001 |
| JP | 2007149775 | 6/2007 |

(Continued)

*Primary Examiner* — Timothy J Thompson
*Assistant Examiner* — Muhammed Azam
(74) *Attorney, Agent, or Firm* — Stanek Lemon Crouse & Meeks, PA (57) ABSTRACT

An apparatus includes a laminated bus bar assembly with first and second bus bars and an intervening insulator layer. A surge arrestor (e.g., a metal oxide varistor) has a body mounted on the bus bar assembly and first and second terminals on first and second opposite sides of the body. In some embodiments, the body may be at least partially disposed in an opening in the first bus bar and the second terminal may be conductively bonded to a surface of the second bus bar that faces the insulator layer. In some embodiments, the second terminal may include a conductive stud passing through an opening in the second bus bar. The apparatus may include a spring clamp attached to the first bus bar and contacting the first side of the body to retain the body.

19 Claims, 10 Drawing Sheets

(56) References Cited

U.S. PATENT DOCUMENTS

| | | | |
|---|---|---|---|
| 3,742,420 A | 6/1973 | Harnden, Jr. | |
| 3,936,133 A * | 2/1976 | Splitt | H01T 4/06 439/54 |
| 4,168,514 A * | 9/1979 | Howell | H01C 7/12 337/28 |
| 4,249,224 A * | 2/1981 | Baumbach | H02H 9/043 337/28 |
| 4,673,229 A * | 6/1987 | Jorgensen | H01R 25/162 174/68.2 |
| 4,806,937 A * | 2/1989 | Peil | G01S 7/03 333/136 |
| 5,200,875 A * | 4/1993 | Yoshioka | H02H 9/042 361/56 |
| 5,412,526 A * | 5/1995 | Kapp | H02H 3/046 360/111 |
| 5,422,440 A * | 6/1995 | Palma | H02G 5/005 174/133 B |
| 5,710,804 A * | 1/1998 | Bhanne | H02B 1/50 379/437 |
| 5,796,039 A * | 8/1998 | Daoud | H04Q 1/11 174/59 |
| 5,953,193 A * | 9/1999 | Ryan | G08B 1/08 361/118 |
| 5,966,282 A * | 10/1999 | Ryan | G08B 1/08 361/118 |
| 5,969,932 A * | 10/1999 | Ryan | G08B 1/08 361/117 |
| 6,058,019 A * | 5/2000 | Graves | H05K 7/1492 361/760 |
| 6,065,206 A * | 5/2000 | West | H02G 5/06 248/49 |
| 6,067,221 A * | 5/2000 | Pelosi | H01T 4/06 24/3.12 |
| 6,198,615 B1 * | 3/2001 | Pelosi | H01L 25/071 257/E25.015 |
| 6,411,486 B1 * | 6/2002 | Doneghue | H01H 9/14 361/118 |
| 6,489,567 B2 * | 12/2002 | Zachrai | H02G 5/025 174/149 B |
| 7,274,187 B2 * | 9/2007 | Loy | G01R 22/065 324/142 |
| 7,578,682 B1 * | 8/2009 | Hughes | H02G 15/06 439/89 |
| 8,163,998 B2 * | 4/2012 | Bhathija | H01R 25/145 174/68.2 |
| 8,345,400 B2 * | 1/2013 | Veskovic | H02H 9/005 361/117 |
| 9,655,265 B2 * | 5/2017 | Pon | H01L 23/645 |
| 2001/0015685 A1 | 8/2001 | McLoughlin | |
| 2006/0067059 A1 * | 3/2006 | Ushijima | H01L 25/162 361/715 |
| 2006/0087181 A1 * | 4/2006 | Kusumi | H02J 7/248 310/68 D |
| 2006/0172601 A1 * | 8/2006 | Faulkner | H01R 31/065 439/607.05 |
| 2007/0091652 A1 * | 4/2007 | Hirota | H02M 7/003 363/37 |
| 2007/0293073 A1 * | 12/2007 | Hughes | H01H 33/66207 439/187 |
| 2008/0062619 A1 * | 3/2008 | Parker | H02B 1/20 361/605 |
| 2008/0259586 A1 * | 10/2008 | Hosokawa | B60R 16/0239 361/813 |
| 2009/0002956 A1 * | 1/2009 | Suwa | B60L 1/003 361/728 |
| 2010/0148298 A1 * | 6/2010 | Takano | H01L 23/49575 257/500 |
| 2011/0309715 A1 * | 12/2011 | Claessens | H01B 3/56 310/273 |
| 2012/0106220 A1 * | 5/2012 | Yamaguchi | H05K 7/209 363/131 |
| 2012/0243136 A1 * | 9/2012 | Mossoba | H02H 9/041 361/91.1 |
| 2012/0305283 A1 * | 12/2012 | Kalayjian | H05K 7/1432 174/68.2 |
| 2013/0221292 A1 * | 8/2013 | Ingold | H01B 3/56 252/571 |
| 2013/0265692 A1 * | 10/2013 | Mandizadeh | H01B 3/56 361/601 |
| 2014/0000927 A1 * | 1/2014 | Hashimoto | H02G 5/005 174/68.2 |
| 2014/0077611 A1 * | 3/2014 | Young | H05K 7/1432 307/82 |
| 2014/0116751 A1 * | 5/2014 | Hatori | H02M 7/003 174/129 B |
| 2014/0125319 A1 * | 5/2014 | Shea | G01R 31/026 324/126 |
| 2015/0285692 A1 * | 10/2015 | Hashimoto | G01K 1/14 374/161 |
| 2017/0186551 A1 * | 6/2017 | Matsumoto | H01G 4/38 |
| 2017/0229379 A1 * | 8/2017 | Hayase | H01L 21/4814 |
| 2018/0148855 A1 * | 5/2018 | Nakagawa | C25D 13/12 |

FOREIGN PATENT DOCUMENTS

| | | |
|---|---|---|
| WO | WO2009/141437 | 11/2009 |
| WO | WO2011/152544 | 12/2011 |
| WO | WO2016/161546 | 10/2016 |

* cited by examiner

BUS BAR ASSEMBLY WITH INTEGRATED SURGE ARRESTOR

STATEMENT OF GOVERNMENT SUPPORT

This invention was made with Government support under Contract # N00014-14-C-0123 awarded by the Office of Naval Research. The Government has certain rights in this invention.

BACKGROUND

The inventive subject matter relates to electrical power apparatus and methods and, more particularly, to protection apparatus for electrical power systems.

Surge arrestors, such as metal oxide varistors (MOVs), are commonly used to protect electronic devices from overvoltage conditions that can lead to damage and/or destruction. MOVs commonly have terminals that are connected to the protected device using wires or similar conductors. MOVs for lower voltage applications may be packaged in a number of different ways, including in leaded packages and leadless packages, such as surface mount packages. MOVs for use in surge arrestors for higher voltage applications, such as electrical power distribution applications, may also be fabricated as cylindrical disks.

SUMMARY

Some embodiments of the inventive subject matter provide an apparatus including a laminated bus bar assembly including first and second bus bars separated by an insulator layer. The apparatus further includes a surge arrestor (e.g., a metal oxide varistor) having a body configured to be mounted on the bus bar assembly and first and second terminals on first and second opposites sides of the body, the first terminal electrically coupled to the first bus bar and the second terminal electrically coupled to the second bus bar.

In some embodiments, the body may be at least partially disposed in an opening in the first bus bar. In further embodiments, the body may be at least partially disposed in an opening in the insulator layer.

In some embodiments, the second terminal may be conductively bonded to a surface of the second bus bar that faces the insulator layer. In further embodiments, the second terminal may include a conductive stud passing through an opening in the second bus bar.

The first terminal may be electrically coupled to the first bus bar by a conductor, such as a conductive clip or braided conductor. In some embodiments, the apparatus may include a spring clamp or other biasing device attached to the first bus bar and contacting the first side of the body to apply pressure on the body in a direction towards the second bus bar. The first terminal may be electrically coupled to the first bus bar by the spring clamp or by a conductor clamped to the first terminal by the spring clamp.

According to further aspects, the body of the surge arrestor may be disposed in a space between the first bus bar and the second bus bar. The first terminal may be electrically coupled to the first bus bar by a conductor and the apparatus may further include a spring or other biasing device disposed between the first bus bar and the body and configured to clamp the conductor to the first terminal.

In further embodiments, the first bus bar may be electrically connected to a first terminal of a transistor and the second bus bar may be electrically connected to a second terminal of a transistor. The surge arrestor may limit a voltage between the first and second terminals of the transistor.

Still further embodiments provide an apparatus including a laminated bus bar assembly including first and second bus bars separated by an insulator layer. The apparatus also includes a surge arrestor including a body passing through an opening in the insulator layer and having a conductive surface at an end of the body bonded to a surface of the second bus bar. The apparatus further includes a biasing device (e.g., a spring) that applies a force to the body towards the surface of the second bus bar.

The conductive surface may include a first conductive surface at a first end of the body. The surge arrestor may further include a second conductive surface at a second end of the body and electrically coupled to the first bus bar by the biasing device and/or or a conductor disposed between the biasing device and the second conductive surface. The body may pass through an opening in the first bus bar and the biasing device may include a spring clip attached to the first bar. In further embodiments, the biasing device may include a spring disposed between the first bus bar and the body.

Additional embodiments provide an apparatus including a laminated bus bar assembly including first and second bus bars separated by an insulator layer. The apparatus further includes a surge arrestor including a body passing through an opening in the first bus bar and a conductive stud extending from an end of the body, passing through an opening in the second bus bar and fastened to the second bus bar. The conductive stud may include a first conductive stud extending from a first end of the body and the surge arrestor may further include a second conductive stud extending from a second end of the body and electrically coupled to the first bus bar.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 1:
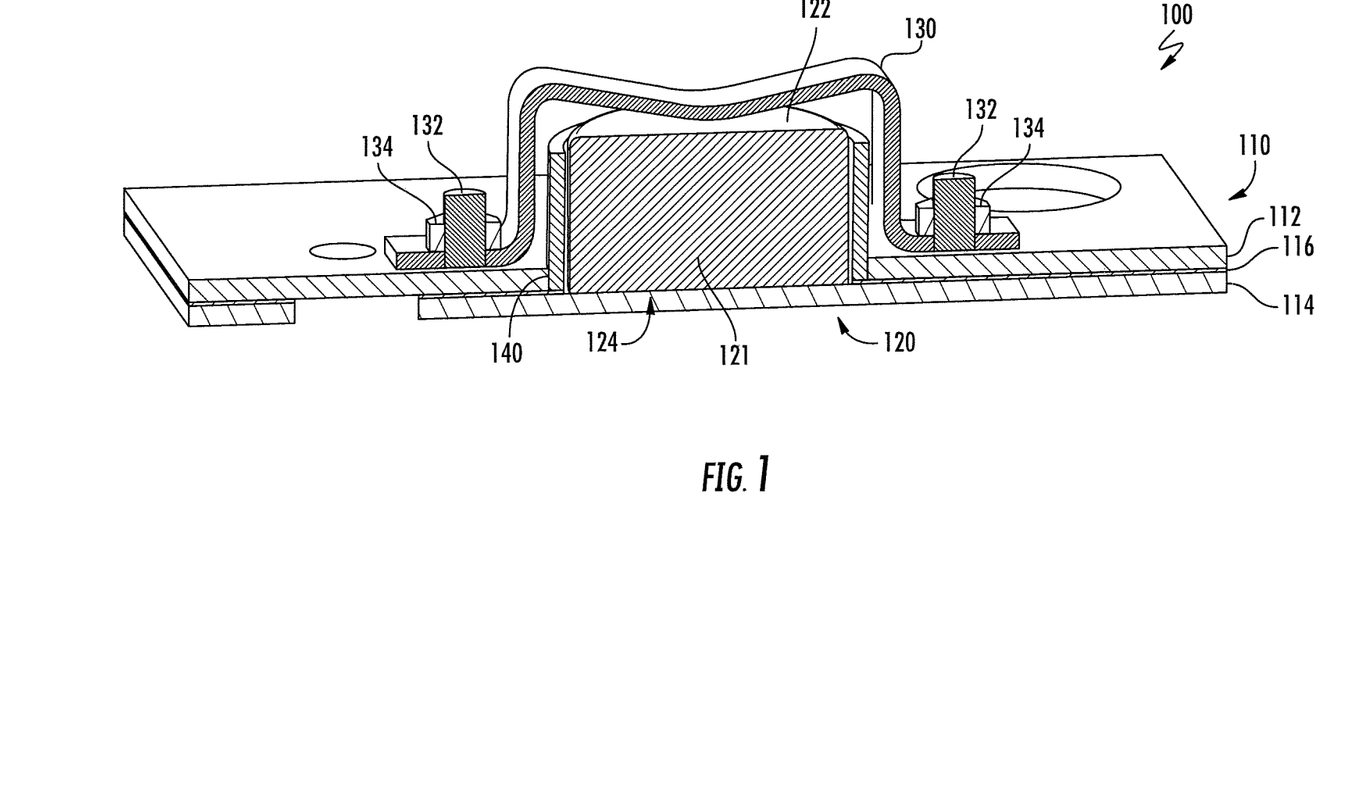
FIG. 1 is a cross-sectional view of an apparatus including a laminated bus assembly with an integrated surge arrestor according to some embodiments of the inventive subject matter.

FIG. 1 illustrates an apparatus 100 including a laminated bus bar assembly 110 integrated with a surge arrestor device 120 according to some embodiments. The laminated bus bar assembly 110 includes first and second conductive bus bars 112, 114 which are separated from one another by an insulator layer 116. The surge arrestor 120, e.g., a metal oxide varistor (MOV), has a body, here shown as a cylindrical body 121, with first and second conductive terminal surfaces 122, 124 at respective ends thereof. While an MOV with a cylindrical body is illustrated, it will be appreciated that the MOV may have other shapes, such cuboid, polygonal prism and other shapes. The cylindrical body 121 is disposed in openings in the first bus bar 112 and the insulator layer 116, such that the lower conductive surface 124 contacts the second bus bar 114. The lower conductive surface 124 may be electrically bonded to the second bus bar 114 by, for example, soldering, brazing, conductive epoxy or other connection techniques. The lower conductive surface 124 of the surge arrestor 120 may be, for example, a conductive copper end cap that may provide low inductance and facilitate fabrication of a soldered or brazed connection to the second bus bar 114. An insulator 140 may be disposed between the cylindrical body 121 and the first bus bar 112.

As further shown, the cylindrical body 121 may be secured to the laminated bar assembly 110 using a spring clamp 130. The spring clamp 130 may be attached to the first bus bar 112 using, for example, threaded studs 132 embedded in the first bus bar 112 and nuts 134 that secure the spring clamp 130 to the first bus bar 112. The spring clamp 130 may apply a force on the cylindrical body 121 in a direction towards the second bus bar 114. As illustrated, the spring clamp 130 may be conductive and thus may provide an electrical coupling of the upper conductive surface 122 of the surge arrestor 120 to the first bus bar 112.

Figure 2:
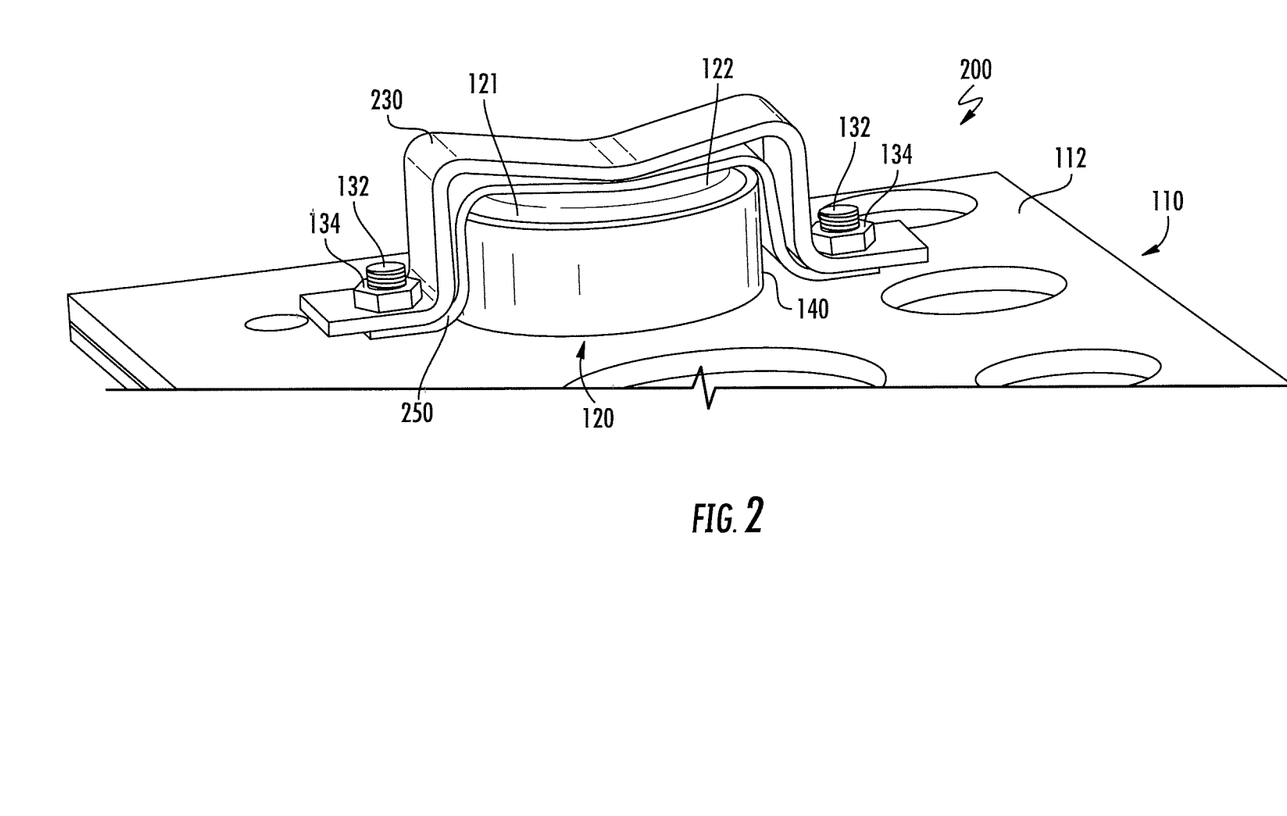
FIG. 2 is a perspective view of an apparatus including a laminated bus assembly with an integrated surge arrestor bonded to a bus bar according to further embodiments of the inventive subject matter.
Figure 3:
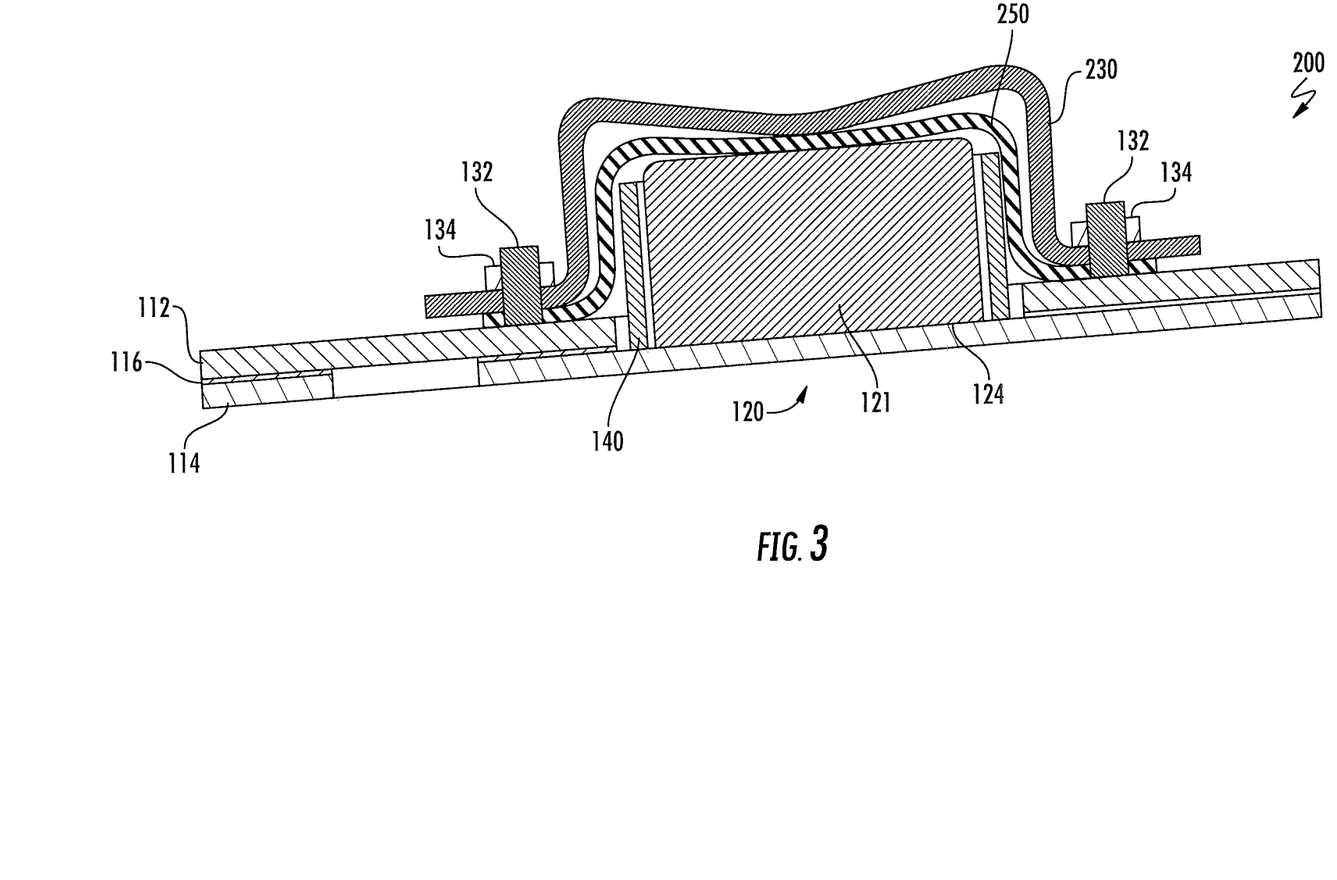
FIG. 3 is a cross-sectional view of the apparatus of FIG. 2.

An apparatus 200 illustrated in FIGS. 2 and 3 includes an alternative structure having a different arrangement for coupling the surge arrestor 120 to the first bus bar 112. In particular, a braided conductor 250 is provided between a spring clamp 230 and the upper conductive surface 124 of the surge arrestor 120. The spring clamp 230 presses the braided conductor 250 against the upper conductive surface 122 of the surge arrestor 120 to provide an electrical connection. In some embodiments, a conductor, such as the braided conductor 250, may be bonded to the upper conductive surface 122 by, for example, soldering, brazing, conductive epoxy, stud/nut connections or other connection techniques. As shown, the braided conductor 250 may be electrically connected to the first bus bar 112 using studs 130 and nuts 132, which may also be used to attach the spring clamp 230 to the first bus bar 112.

Figure 4:
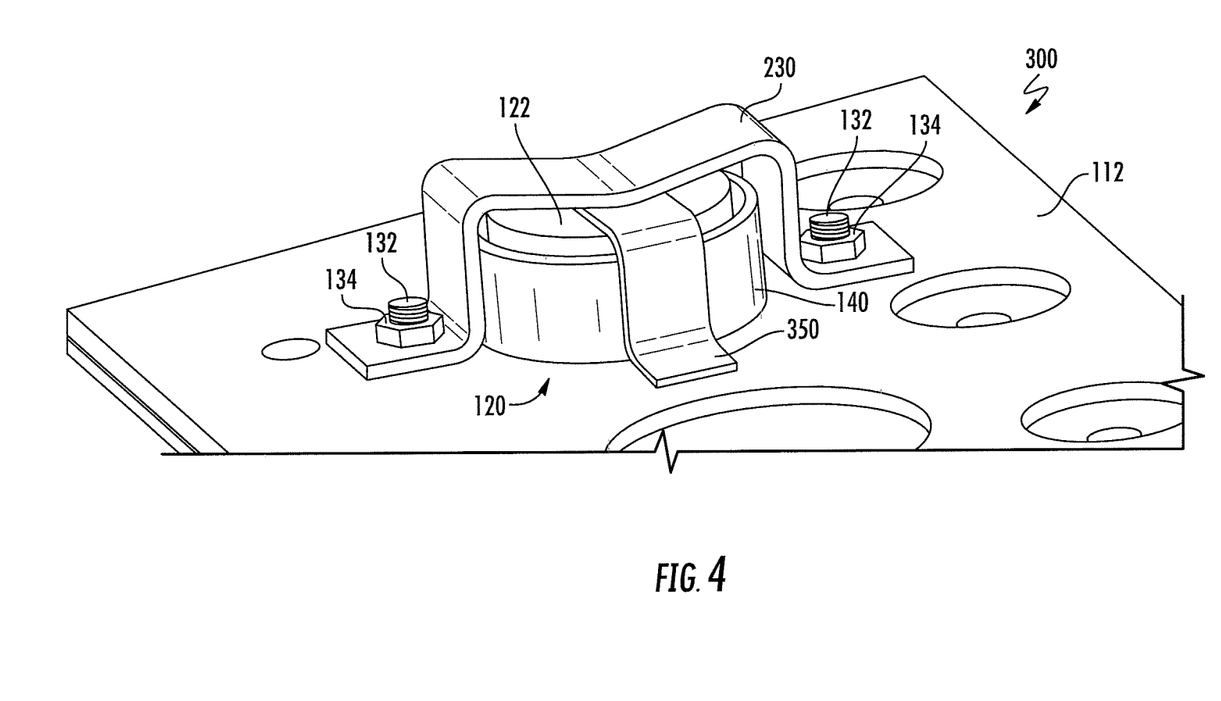
FIG. 4 is a perspective view of an apparatus including a laminated bus assembly with an integrated surge arrestor bonded to a bus bar according to further embodiments of the inventive subject matter.

FIG. 4 illustrates an apparatus 300 according to yet further embodiments that uses a different arrangement of a braided conductor to connect the upper conductive surface 122 of the surge arrestor 120. In this arrangement, a braided conductor 350 is conductively bonded (e.g., affixed with a stud/nut, soldered, brazed or connected with a conductive epoxy) to the first bus bar 112. A spring clamp 230 is aligned transverse to the braided conductor 350 and presses the braided conductor 350 to the upper conductive surface 122 of the surge arrestor 120.

Figure 5:
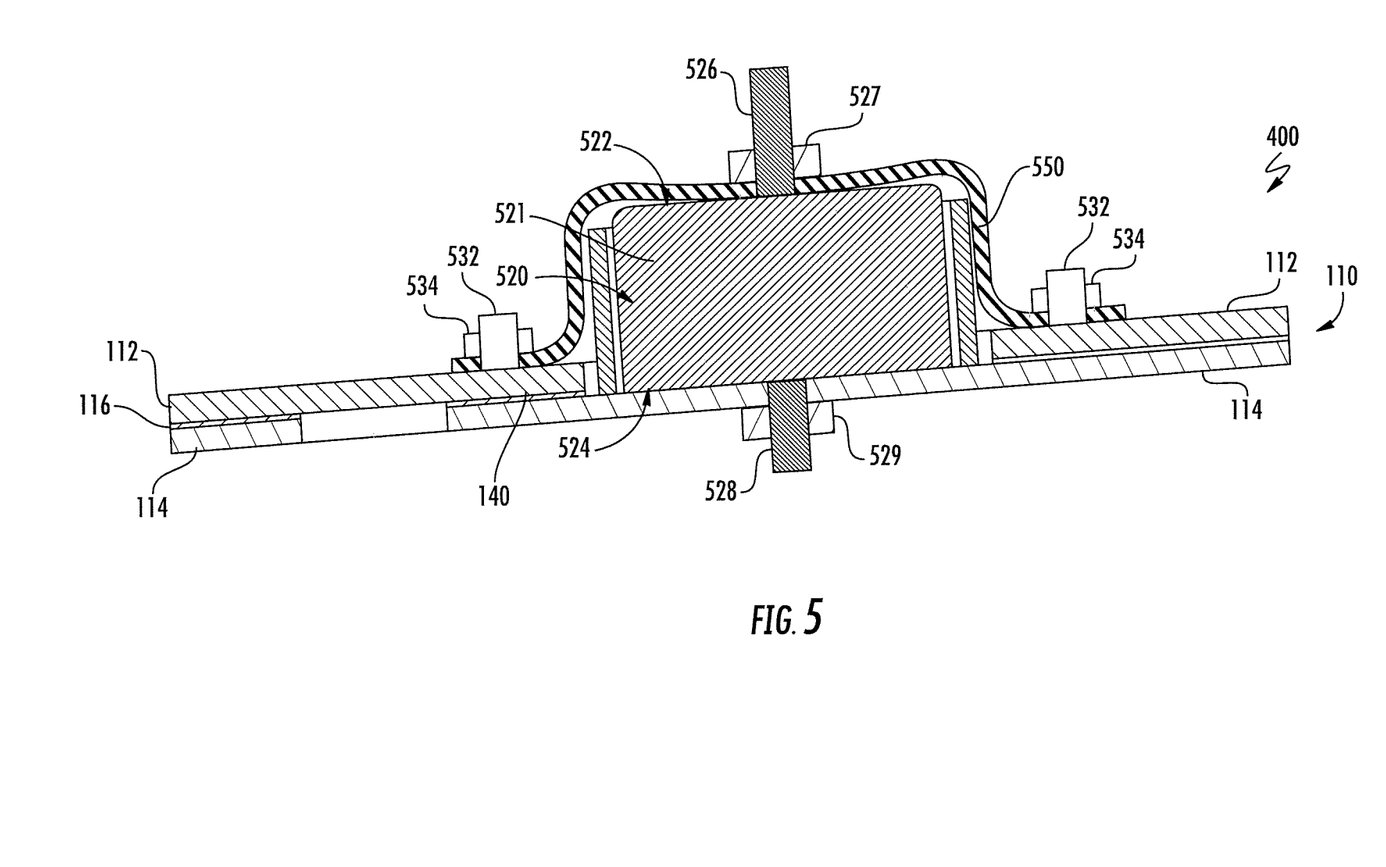
FIG. 5 is a section view of an apparatus including a laminated bus assembly with an integrated surge arrestor bolted to a bus bar according to some embodiments of the inventive subject matter.

According to further embodiments, other means may be used to provide connection of an integrated surge arrestor in a laminated bus assembly. FIG. 5 shows an apparatus 400 in which a surge arrestor 520 includes a cylindrical body 521 and terminals in the form of first and second threaded studs 526, 528 extending from respective ends 522, 524 of the cylindrical body 521. The first threaded stud 526 is electrically connected to a braided connector 550 that is conductively bonded to a first bus bar 112 using a stud 532 and nut 534. A nut 527 secures the braided conductor 550 to the threaded stud 526. The cylindrical body 521 extends through openings in the first bus bar 112 and an insulator layer 116, and the second threaded stud 528 passes through an opening in a second bus bar 114. A nut 529 secures the second threaded stud 528 to the second bus bar 114.

Figure 6:
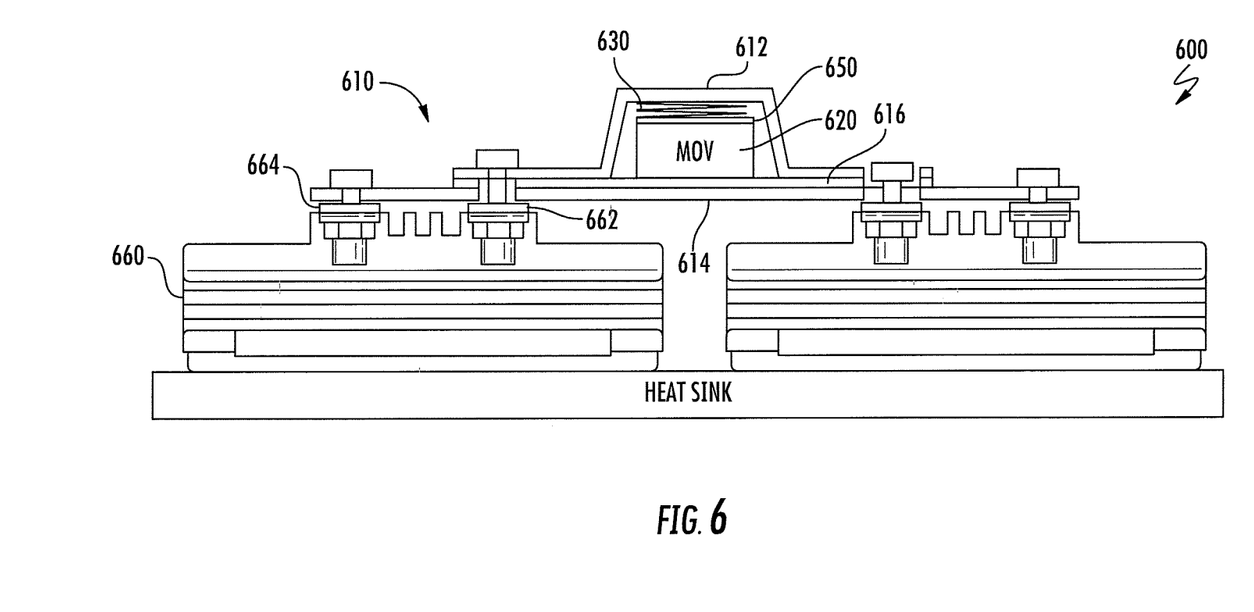
FIG. 6 is a side view of an electronic apparatus including transistors coupled to a surge arrestor integrated with a laminated bus bar assembly according to some embodiments of the inventive subject matter.
Figure 7:
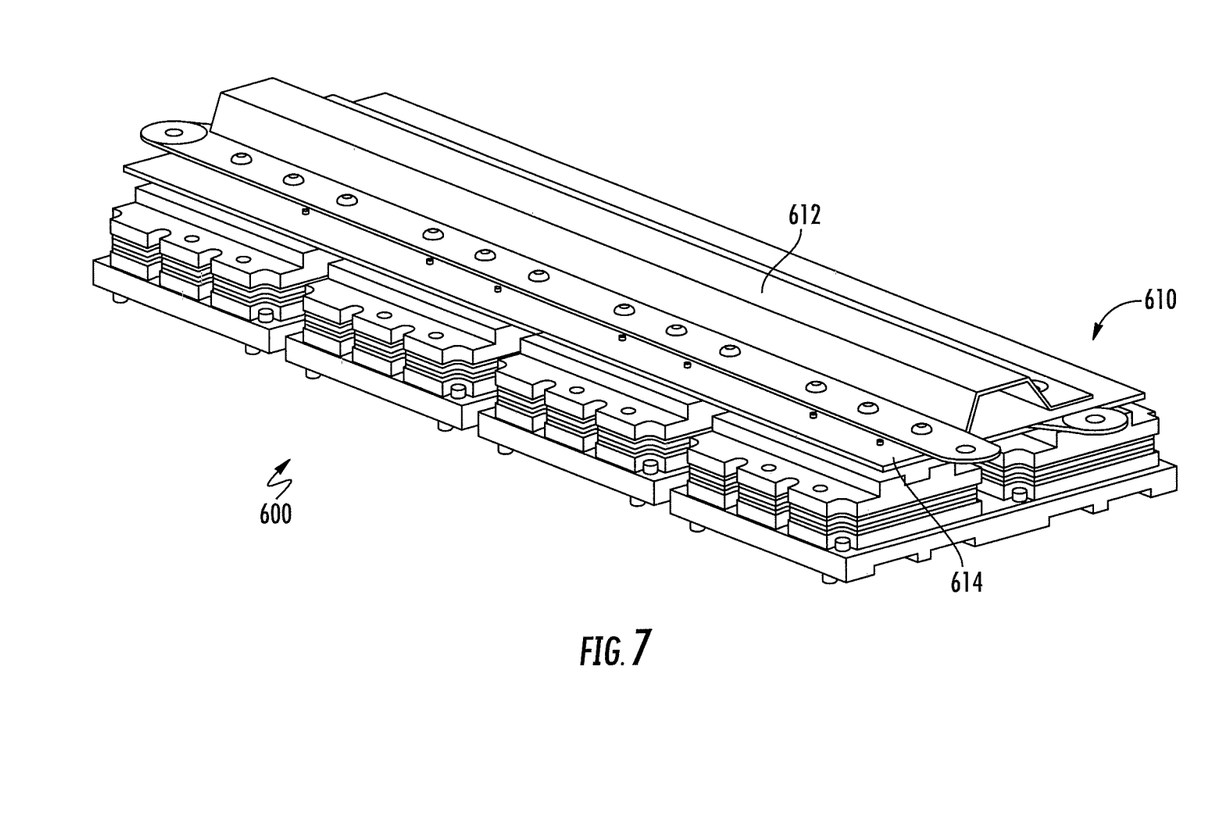
FIG. 7 is a perspective view of the electronic apparatus of FIG. 6
Figure 8:
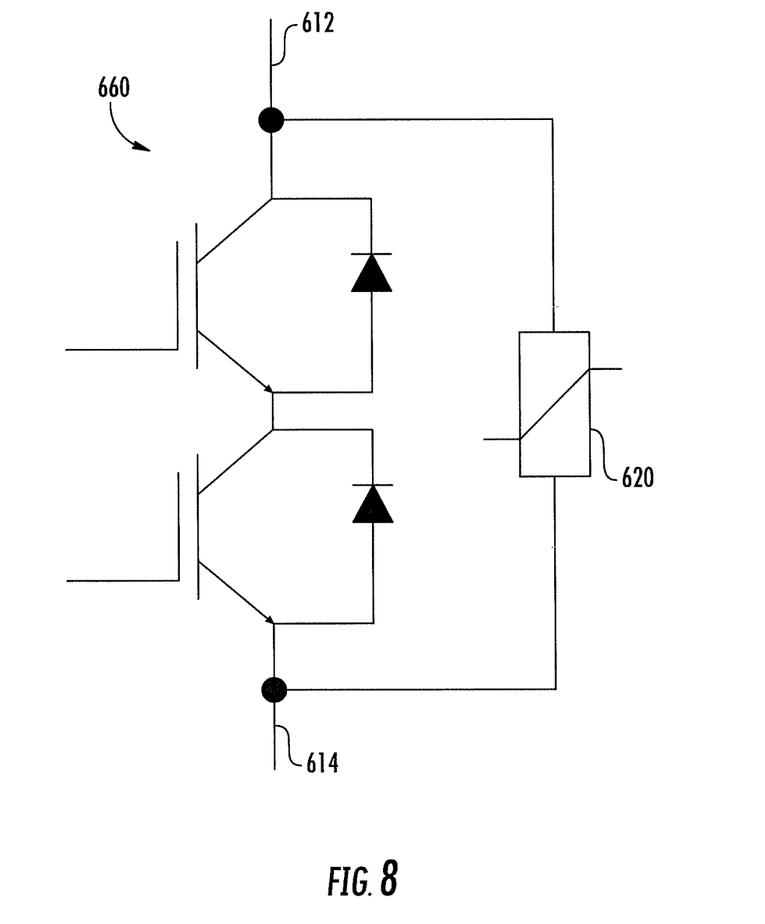
FIG. 8 is a circuit schematic diagram of the electronic apparatus of FIGS. 6 and 7.

Embodiments of the inventive subject matter may be particularly advantageous in applications in which low inductance surge arrestor connections are desirable. For example, FIGS. 6 and 7 illustrate an electronic apparatus 600 including insulated gate bipolar transistor packages 660 that are interconnected by a laminated bus assembly 610 including first and second conductive buses 612, 614 that are separated by an insulator layer 616. The first bus 612 is connected to a first terminal 662 of the transistor package 660 and the second bus 614 is connected to a second terminal 664 of the transistor package 660. A surge arrestor in the form of an MOV 620 is connected between the first and second buses 612, 614. FIG. 8 schematically illustrates these electrical interconnections.

As shown in FIG. 6, the MOV 620 is integrated with the laminated bus assembly. In particular, the MOV 620 is disposed between the second conductive bus 614 and an elevated portion of the first conductive bus 612. A lower conductive surface of the MOV 620 is electrically bonded to the second bus 614, while an upper conductive surface of the MOV 620 is coupled to the upper bus via a braided conductor 650 that is connected to the first conductive bus 612 and held against the upper conductive surface of the MOV 620 by a biasing device, here shown as a spring 630 disposed between the first conductive bus 612 and the MOV 620. Although a spring 630 is shown in FIG. 6, some embodiments may use other types of biasing devices, such as retaining screws, shims, clamps, and the like.

Figure 9:
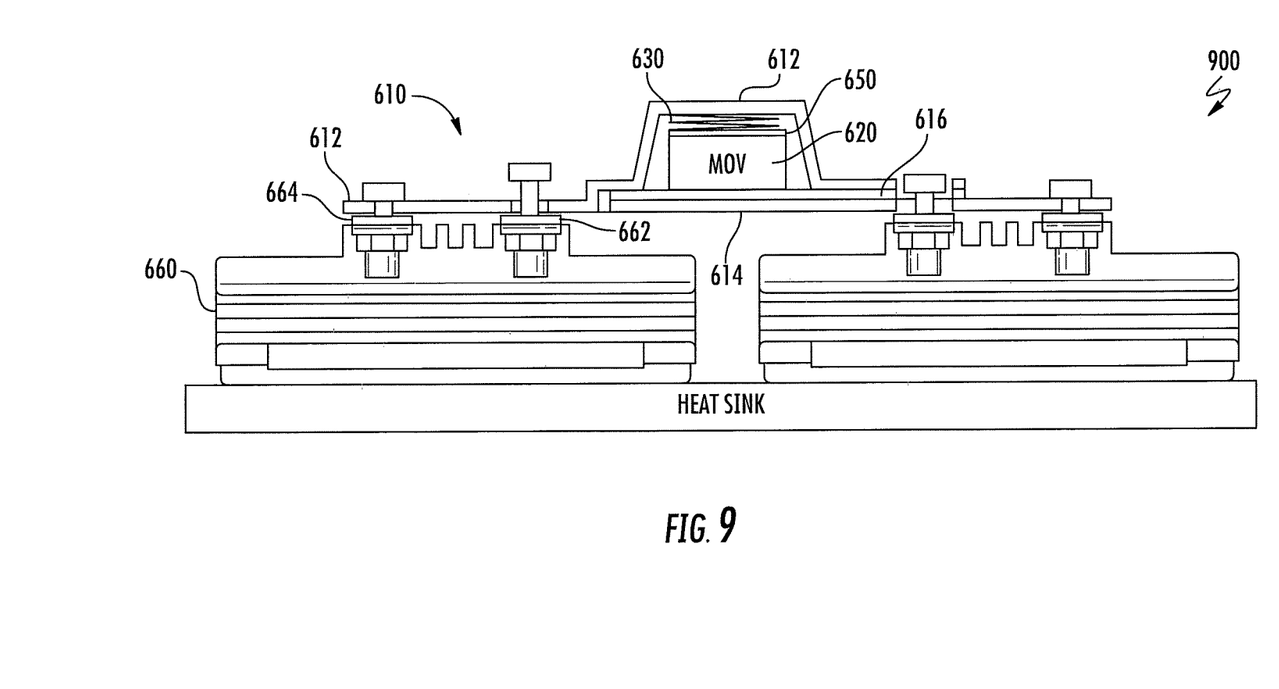
FIG. 9 is a side view of an electronic apparatus including transistors coupled to a surge arrestor integrated with a laminated bus bar assembly according to further embodiments of the inventive subject matter.

FIG. 9 illustrates another arrangement of an apparatus 900 similar to the that illustrated in FIGS. 6 and 7, except portions of the second bus 614 and insulator 616 are cut away above the transistor package 660 and the first conductive bus included a descending portion that rests directly on the transistor terminal 662.

Figure 10:
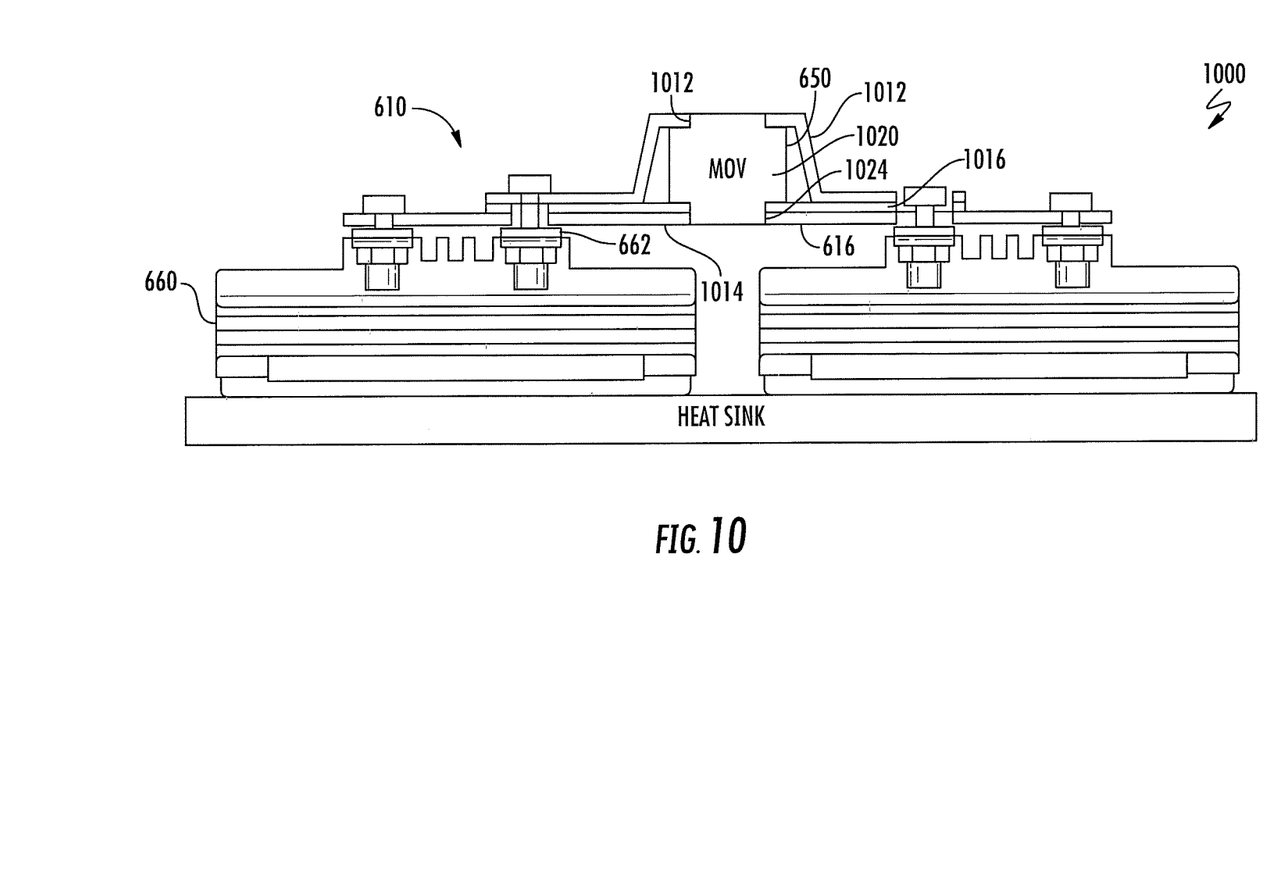
FIG. 10 is a side view of an electronic apparatus including transistors coupled to a surge arrestor integrated with a laminated bus bar assembly according to still further embodiments of the inventive subject matter.

FIG. 10 illustrates an apparatus 1000 according to further embodiments. The apparatus 1000 is similar to the apparatus 600 illustrated in FIGS. 6 and 7, except for the use of an MOV 1020 that has first and second conductive bosses 1022, 1024. The bosses 1022, 1024 may be cylindrical and configured to be press fit into openings in respective ones of first and second buses 1012, 1014 separated by an insulator layer 1016 to provide electrical connection of the MOV 1020 between the first and second buses 1012, 1014.

It will be appreciated that embodiments of the inventive subject matter may be used in a variety of different applications other than the semiconductor device protection applications described above, and that, embodiments of the inventive subject matter are generally applicable to any surge arrestor application. It will be further understood that structural arrangements along the lines described above for integrating an MOV into an electrical bus bar assembly may also be used to integrate other devices, such as other types of semiconductors (e.g., diodes, thyristors, etc.), with bus bar assemblies.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   a laminated bus bar assembly comprising first and second bus bars separated by an insulator layer; and
   a surge arrestor comprising:
      a body configured to be mounted on the bus bar assembly and at least partially disposed in an opening in the first bus bar; and
      first and second terminals on first and second opposite sides of the body, the first terminal electrically coupled to the first bus bar and the second terminal electrically coupled to the second bus bar.

2. An apparatus comprising:
   a laminated bus bar assembly comprising first and second bus bars separated by an insulator layer; and
   a surge arrestor comprising a body passing through an opening in the first bus bar and a conductive stud extending from an end of the body, passing through an opening in the second bus bar.

3. The apparatus of claim 1, wherein the body is at least partially disposed in an opening in the insulator layer.

4. The apparatus of claim 1, wherein the second terminal is conductively bonded to a surface of the second bus bar that faces the insulator layer.

5. The apparatus of claim 1, wherein the second terminal comprises a conductive boss or stud passing through an opening in the second bus bar.

6. The apparatus of claim 1, wherein the first terminal is electrically coupled to the first bus bar by a conductor.

7. The apparatus of claim 1, further comprising a spring clamp attached to the first bus bar and contacting the first side of the body to apply pressure on the body in a direction towards the second bus bar.

8. The apparatus of claim 7, wherein the first terminal is electrically coupled to the first bus bar by the spring clamp or by a conductor clamped to the first terminal by the spring clamp.

9. An apparatus comprising:
   a laminated bus bar assembly comprising first and second bus bars separated by an insulator layer; and
   a surge arrestor comprising:
      a body configured to be mounted on the bus bar assembly and disposed in a space between the first bus bar and the second bus; and
      first and second terminals on first and second opposite sides of the body, the first terminal electrically coupled to the first bus bar and the second terminal electrically coupled to the second bus bar.

10. The apparatus of claim 9, wherein the first terminal is electrically coupled to the first bus bar by a conductor and wherein the apparatus further comprises a spring disposed between the first bus bar and the body and configured to clamp the conductor to the first terminal.

11. The apparatus of claim 1, wherein the first bus bar is electrically connected to a first terminal of a transistor and wherein the second bus bar is electrically connected to a second terminal of the transistor and wherein the surge arrestor limits a voltage between the first and second terminals of the transistor.

12. An apparatus comprising:
   a laminated bus bar assembly comprising first and second bus bars separated by an insulator layer; and
   a surge arrestor comprising a body passing through an opening in the insulator layer and having a conductive surface at an end of the body bonded to a surface of the second bus bar; and
   a biasing device that applies a force to the body towards the surface of the second bus bar.

13. The apparatus of claim 12, wherein the conductive surface comprises a first conductive surface at a first end of the body and wherein the surge arrestor further comprises a second conductive surface at a second end of the body and electrically coupled to the first bus bar by the biasing device and/or a conductor disposed between the biasing device and the second conductive surface.

14. The apparatus of claim 12, wherein the body passes through an opening in the first bus bar and wherein the biasing device comprises a spring clip attached to the first bus bar.

15. The apparatus of claim 12, wherein the biasing device comprises a spring disposed between the first bus bar and the body.

16. The apparatus of claim 12, wherein the first bus bar is electrically connected to a first terminal of a transistor and wherein the second bus bar is electrically connected to a second terminal of the transistor and wherein the surge arrestor limits a voltage between the first and second terminals of the transistor.

17. The apparatus of claim 12, wherein the body is cylindrical.

18. The apparatus of claim 2, wherein the first bus bar is electrically connected to a first terminal of a transistor and wherein the second bus bar is electrically connected to a second terminal of the transistor and wherein the surge arrestor limits a voltage between the first and second terminals of the transistor.

19. The apparatus of claim 2, wherein the conductive stud comprises a first conductive stud extending from a first end of the body and wherein the surge arrestor further comprises a second conductive stud extending from a second end of the body and electrically coupled to the first bus bar.

* * * * *